United States Patent [19]
Stevens et al.

[11] Patent Number: 5,111,111
[45] Date of Patent: May 5, 1992

[54] METHOD AND APPARATUS FOR COUPLING A MICROWAVE SOURCE IN AN ELECTRON CYCLOTRON RESONANCE SYSTEM

[75] Inventors: James E. Stevens, Princeton; Joseph L. Cecchi, Lawrenceville, both of N.J.; Patrick L. Colestock, St. Charles, Ill.

[73] Assignee: Consortium for Surface Processing, Inc., Princeton, N.J.

[21] Appl. No.: 589,078

[22] Filed: Sep. 27, 1990

[51] Int. Cl.$^5$ .............................................. H05H 1/46
[52] U.S. Cl. .................... 315/111.41; 315/111.21; 313/231.31; 204/298.38
[58] Field of Search ............... 315/111.21, 111.41, 315/111.81; 313/231.31; 250/433 R; 204/298.38

[56] References Cited

U.S. PATENT DOCUMENTS

| | | | |
|---|---|---|---|
| 4,409,520 | 10/1983 | Koike et al. | 250/423 R X |
| 4,417,178 | 11/1983 | Geller et al. | 315/111.81 |
| 4,450,031 | 5/1984 | Ono et al. | 156/345 |
| 4,507,588 | 3/1985 | Asmussen et al. | 315/39 |
| 4,727,293 | 2/1988 | Asmussen et al. | 315/111.41 |
| 4,788,473 | 11/1988 | Mori et al. | 315/39 |
| 4,831,963 | 5/1989 | Saito et al. | 204/298.38 X |
| 4,859,908 | 8/1989 | Yoshida et al. | 315/111.81 |
| 4,866,346 | 9/1989 | Graudreau et al. | 315/111.21 |
| 4,877,509 | 10/1989 | Ogawa et al. | 204/298 |
| 4,970,435 | 11/1990 | Tanaka et al. | 315/111.21 |
| 4,987,284 | 1/1991 | Fujimura et al. | 204/298.38 X |
| 5,003,152 | 3/1991 | Matsuo et al. | 204/298.38 X |

FOREIGN PATENT DOCUMENTS

| | | |
|---|---|---|
| 0273741 | 7/1988 | European Pat. Off. |
| 63-227777 | 9/1988 | Japan |

OTHER PUBLICATIONS

The Efficient Inject of High Microwave Powers into the Overdense Magnetoactive Plasma in the Waveguide, Musil, J. et al., Czech. J. Phys. B23 (1973), pp. 736-741.

An Experimental X-Band Electron-Cyclotron-Resonance Plasma Accelerator, IEEE Transactions on Microwave Theory and Techniques, pp. 162-164, Mar. 1966.

Non-Linear Electromagnetic Wave Transformation In a Longitudinally Magnetized Plasma Waveguide, A. Vegas et al., Plasma Physics and Controlled Fusion, vol. 26, No. 12B, pp. 1579-1589, 1984.

Anamalous Absorption of Intense Electromagnetic Waves in Plasma at High Magnetic Fields, J. Musil et al., Plasma Physics, vol. 16, pp. 735-739, Pergamon Press 1974.

Penetration Of A Strong Electromagnetic Wave In An Inhomogeneous Plasma Generated By ECR Using a Magnetic Beach, J. Musil et al., Plasma Physics, vol. 13, pp. 471-476, Pergamon Press 1971.

(List continued on next page.)

Primary Examiner—Eugene R. LaRoche
Assistant Examiner—Do Hyun Yoo
Attorney, Agent, or Firm—Bell, Seltzer, Park & Gibson

[57] ABSTRACT

A microwave source is coupled to an electron cyclotron resonance (ECR) system by circularly polarizing the microwave energy from the source in an angular direction with cooperates with the ECR system's magnetic field to produce electron cyclotron resonance, and coupling the circularly polarized microwave energy to the plasma using a quarter wave vacuum window transformer having a dielectric constant which matches the impedance of the circularly polarized microwave energy to the impedance of the plasma. The impedance matching transformer is preferably a vacuum window of the ECR chamber having quarter wave thickness and the appropriate dielectric constant. For high density plasmas in a standard ECR system of 6 cm radius an alumina window 0.98 cm thick procides optimum coupling. The reflected power from the plasma is thereby minimized to provide a dense plasma for the ECR tool while reducing or eliminating the need for manual external tuners for the microwave source.

15 Claims, 7 Drawing Sheets

OTHER PUBLICATIONS

Electron-Cyclotron Resonance Heating of Alkali Plasmas, A. Levin, et al. Journal of Applied Physics, vol. 38, No. 11, 4435-4440, Oct. 1967.

Acceleration Continue De Plasma A. Gradients De Champs Electromagnetique Et Magnetsave Statique, Resultats Experimentaux, R. Bardet et al., Physics Letters, vol. 10, No. 1, May 1964.

Plasma Etching With A Microwave Cavity Plasma Disk Source, J. Hopwood et al. J. Vac. Sci. Technol. B6 (1), Jan/Feb. 1988, pp. 268-271.

Reactive Ion Beam Etching Using A Broad Beam ECR Ion Source, S. Matsuo et al., Japanese Journal of Applied Physics, vol. 21, No. 1, Jan. 1982, pp. L4-L6.

Microwave Multipolar Plasmas Excited by Distributed Electron Cyclotron Resonance:Concept and Performance, M. Pichot et al., Rev. Sci. Instrum. 59(7), Jul. 1988, pp. 1072-1075.

Microwave Plasma Etching, K. Suzuki et al., Vaccum, vol. 34, No. 10/11, pp. 953-957, Pergamon Press 1984.

Microwave Plasma Etching, K. Suzuki et al., Japanese Journal of Applied Physics, vol. 16, No. 11, pp. 1979-1984, Nov. 1977.

METHOD AND APPARATUS FOR COUPLING A MICROWAVE SOURCE IN AN ELECTRON CYCLOTRON RESONANCE SYSTEM

FIELD OF THE INVENTION

This invention relates to Electron Cyclotron Resonance (ECR) systems for processing a sample such as a semiconductor substrate, and more particularly to a method and apparatus for coupling a microwave source in an ECR system.

BACKGROUND OF THE INVENTION

Electron cyclotron resonance (ECR) systems, also referred to as ECR tools, have been widely investigated and are increasingly being used for high speed processing of samples such as semiconductor substrates. For example, ECR tools are typically used to etch a semiconductor substrate or to deposit thin films of materials on such a substrate.

As is well known to those having skill in the art, an ECR tool typically includes an airtight processing chamber and a microwave source for generating microwave energy and applying the microwave energy to the chamber. A magnetic field is also generated in the processing chamber. A gas is supplied in the processing chamber, with the particular gas depending upon the particular operation to be performed. The frequency of the microwaves and the magnetic field strength are chosen to create electron cyclotron resonance in the electrons in the gas, to thereby generate a plasma of the gas in the processing chamber. The plasma generates from the gas the reactive species which are used to perform etching or deposition according to well known techniques.

ECR tools possess a number of advantages compared to conventional deposition and etch tools. For example, ECR tools provide electrodeless operation which reduces chamber wall contamination. The low plasma potential operation provided by ECR tools reduces ion induced surface damage to the substrate itself. Moreover, high plasma density and low pressure operation can produce high deposition and etch rates with low particulate formation. These advantages have become increasingly important for processing state of the art integrated circuits as device features shrink to submicron sizes. The general design and operation of ECR tools is described in U.S. Pat. No. 4,859,908 to Yoshida et al. entitled *Plasma Processing Apparatus for Large Area Ion Irradiation;* U.S. Pat. No. 4,727,293 to Asmussen et al. entitled *Plasma Generating Apparatus Using Magnets and Methods;* U.S. Pat. No. 4,450,031 to Ono et al. entitled *Ion Shower Apparatus;* U.S. Pat. No. 4,417,178 to Geller et al. entitled *Process and Apparatus For Producing Highly Charged Large Ions and an Application Utilizing This Process,* and Japanese published patent application 88-310887/44 entitled *Film Forming Plasma-Generating Machine.*

Present efforts to improve ECR tools have focused on increasing the uniformity of the plasma generated in the tool and in increasing the overall efficiency of the tool. Increased uniformity is necessary to ensure uniform deposition or etching conditions across the surface of the substrate to be processed. As the size of substrates (wafers) increases, the need for uniformity becomes more critical. Increased efficiency is necessary so that high density plasmas can be generated using minimal microwave and magnetic power to thereby increase processing throughput. Efficiency increases may include, among other things, simplified operation, increased reliability, decreased need for attended operation, and decreased size.

One attempt at increasing the uniformity of the plasma is described in European Patent Application 87/311,451.6 to Nakamura et al. entitled *Plasma Apparatus.* Described is an ECR tool having a second magnet in addition to the main magnet, with the second magnet functioning to more evenly distribute the flux density adjacent the substrate to be processed. Another attempt to improve the plasma azimuthal uniformity is described in U.S. Pat. No. 4,877,509 to Ogawa et al. entitled *Semiconductor Wafer Treating Apparatus Utilizing a Plasma.* Disclosed is a rectangular microwave waveguide having a rectangular-to-circular microwave converter and a circular polarization converter for transforming the circular $TE_{11}$ mode microwave supplied from the rectangular to circular microwave converter into a circularly polarized wave. By using a circular polarized $TE_{11}$ wave, the electric field strength of the microwave supplied to the chamber is azimuthally symmetric when averaged over time to thereby make the density of the plasma generation uniform. Improved etching is thereby provided.

As described above, other attempts to enhance the performance of ECR tools have concentrated on the efficiency of the microwave source itself. For example, U.S. Pat. No. 4,788,473 to Mori et al. entitled *Plasma Generating Device with Stepped Waveguide Transition* describes a microwave source having a rectangular waveguide which is connected to a vacuum sealing dielectric window, with the waveguide tapering in the direction of microwave propagation. The taper is provided by a series of decreasing size waveguides, having quarter wavelength and half wavelength length. The tapering waveguides allow the use of a smaller magnetic coil for generating the magnetic field thereby decreasing the size and weight of the magnetic coil and improving efficiency.

Other attempts to increase ECR efficiency have used external tuners to optimally tune the incoming microwave energy and eliminate unwanted reflection. See for example U.S. Pat. No. 4,507,588 to Asmussen et al. entitled *Ion Generating Apparatus and Method for the Use Thereof.* As disclosed, the microwave source coupler is tuned by means of a "sliding short" during operation. This external tuning is helpful to reduce reflection of the microwaves.

Unfortunately, the use of external tuning is undesirable in ECR tools for many reasons. First, external tuning must typically be manually performed, and readjustment is typically required for each new plasma condition. In fact, readjustment is often required even if plasma conditions are unchanged, because of unavoidable changes in the process. Moreover, it is often difficult to tune the microwave source at all due to the number of modes which are being launched by the microwave source. Accordingly, often the plasma jumps between modes and hysteresis can occur in the tuning. The need for external tuners makes ECR tool operation and process development less repeatable and also prevents the achievement of optimum plasma densities, thereby reducing the available processing rate.

SUMMARY OF THE INVENTION

It is therefore an object of the present invention to provide a method and apparatus for efficiently coupling a microwave source in an Electron Cyclotron Resonance (ECR) tool.

It is another object of the present invention to provide a method and apparatus for coupling a microwave source in an ECR tool to generate high density, uniform plasma for processing a sample.

It is still another object of the present invention to provide a method and apparatus for coupling a microwave source in an ECR tool which reduces the need for external tuners.

It is yet another object of the present invention to provide a method and apparatus for efficiently coupling a microwave source in an ECR tool, over a wide range of processing conditions.

These and other objects are provided according to the present invention by coupling a microwave source to an ECR tool processing chamber using a circular polarizer for circularly polarizing the microwave energy in a first angular direction, which cooperates with the magnetic field generated by the ECR tool to produce electron cyclotron resonance. The circular polarizer substantially reduces microwave energy which is circularly polarized in the direction opposite the first angular direction. In other words, only the mode that is absorbed by the ECR resonance is allowed to propagate into the chamber. Typically, for a standard configuration microwave source, the circular polarizing means is a right hand circular polarizing (RHCP) means which substantially reduces left hand circularly polarized microwave energy. Right hand circularly polarized $TE_{11}$ mode waves are preferably created, although higher mode waves may also be used.

Having polarized the microwave energy to a circularly polarized form which is compatible with the magnetic field to produce electron cyclotron resonance, the invention also provides a microwave transformer to directly couple the circular polarizer and the processing chamber. The microwave transformer matches the impedance of the circularly polarized microwave energy to the impedance of the plasma, to thereby enhance the coupling of the circularly polarized microwave energy to the plasma. Impedance matching reduces the amount of reflected microwave energy and optimizes the coupling of the energy to the plasma, thereby increasing the plasma density for a given amount of microwave energy. The need for an external tuner is reduced or eliminated. If necessary, any remnants of reflected energy may be minimized by adjusting the magnetic field strength.

In a preferred embodiment of the present invention, the impedance matching transformer takes the form of a vacuum sealing window which directly couples the circular polarizer to the plasma in the chamber. The thickness and composition of the vacuum window is selected to match the impedance of the circularly polarized microwave energy to the impedance of the plasma in the chamber. In particular, the thickness of the vacuum window is selected to be one quarter wavelength, to thereby reduce reflection of the microwave energy. Also, the dielectric constant of the vacuum window is selected to provide an impedance match between the relatively high impedance waveguide and the low impedance plasma.

The present invention stems from the realization that an electron cyclotron resonance tool requires a vacuum window for isolating the plasma in the chamber from the microwave source. However, the present invention utilizes this vacuum window to act as an impedance matching transformer for optimally coupling the microwave energy from the circular polarizer to the plasma. The vacuum window will act as a microwave circuit element in the ECR tool, since the microwaves must pass through the vacuum window. Accordingly, the dielectric constant and thickness of the window are selected to provide between the microwave source and the plasma.

Present day ECR tools typically use a microwave frequency of 2.45 GHz and a corresponding magnetic field strength of B=875G at the ECR resonance. Assuming B=950G at the vacuum window and a $TE_{11}$ mode in a waveguide radius of 6 cm, the high density plasma generation (i.e., plasma density greater than about $10^{12}$ per cubic centimeter), an ($Al_2O_3$) vacuum window, 0.98 cm thick, having a relative dielectric constant of 9.8, provides coupling. For a low density plasma, (i.e. about $3\times10^{11}$ per cubic centimeter or less), quartz ($SiO_2$) wit relative dielectric constant of about 3.85 provides optimum match, at a thickness of 1.63 cm. It be understood by those having skill in the art that the quarter wavelength condition for the window depends primarily on the dielectric constant, and also on the waveguide radius and the particular mode. The particular window thickness to obtain the quarter wavelength condition may be readily obtained for other ECR tools.

By right hand circularly polarizing the incoming microwave energy and using a quarter wavelength vacuum window for matching, it has been found that average plasma densities twice as high as conventional ECR tools may be with a high degree of azimuthal symmetry, over a range of plasma densities. Accordingly, high density processing is provided, with reduced need for m adjustable external tuning.

DESCRIPTION OF A PREFERRED EMBODIMENT

The present invention now will described more fully hereinafter with reference to accompanying drawings, in which a preferred embodiment of the invention is shown. This invention may, however, be embodiment in many different and should not be construed as limited to the e set forth herein; rather, this embodiment is so that this disclosure will be thorough a co , and will fully convey the scope of the invention those skilled in the art. Like numbers refer like elements throughout For ease of presentation, the design of a conventional Electron Cyclotron Resonance (ECR) tool will first be described. Then a design of an ECR tool according to the present invention will be described. A quantitative (mathematical) explanation of the operation of the invention will then be provided. Finally, experimental data comparing a convention ECR tool with a tool designed according to present invention will be provided.

Conventional ECR Tool

Figure 1:
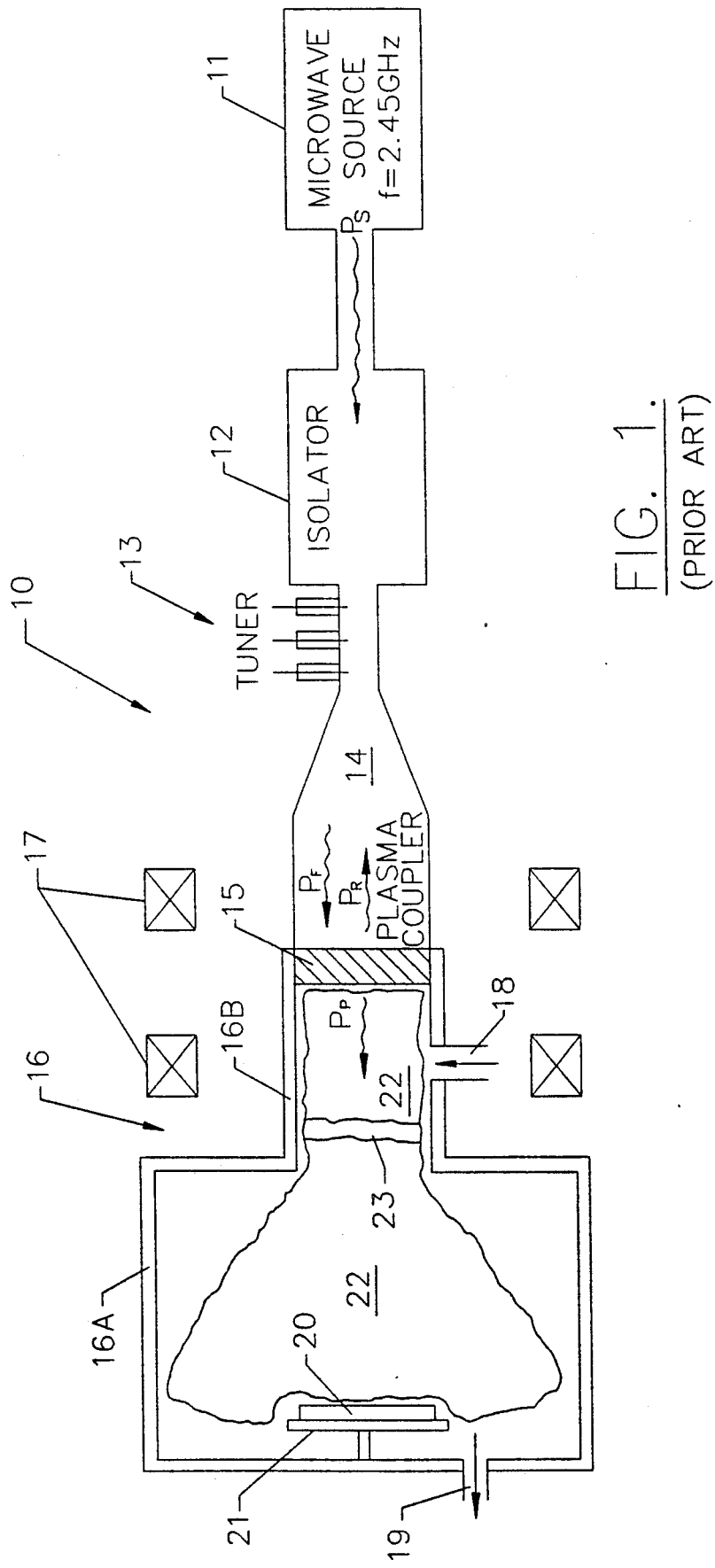
FIG. 1 is a simplified schematic diagram of a conventional ECR tool.

Referring now to FIG. 1, the overall design of a conventional ECR tool will now be described. As shown in FIG. 1, the ECR system or tool 10 typically includes a microwave source 11 which may be of any frequency but which typically emits microwaves at a frequency of 2.45 GHz. Typically the microwaves are emitted in a rectangular waveguide $TE_{10}$ mode although other modes may be used. The microwaves are then coupled to an isolator 12 which may be a circulator with a dummy load, for isolating the microwave source 11 from the remainder of the system. The emitted microwaves then pass through an external tuner 13 which acts as a variable impedance matcher for matching the impedance of the microwaves emerging from isolator 12 to the remainder of the system. Typically, tuner 13 is a three stub tuner, although other tuners are also well known to those having skill in the art.

The tuned microwaves are then coupled to a vacuum window 15 via a plasma coupler 14. The plasma coupler 14 may simply couple the $TE_{10}$ mode to the processing chamber 16 via the window 15. Alternatively, the plasma coupler may also convert the rectangular $TE_{10}$ mode waves to cylindrical $TE_{11}$ waves, cylindrical $TM_{01}$ waves or other modes. The sole function of window 15 is to provide a vacuum seal for the chamber, while allowing microwave energy to pass therethrough. In other words windows 15 function as a physical barrier. Although typical designs have used alumina or quartz windows of arbitrary thickness, the dielectric constant thickness of the window have not heretofore been regarded as design parameters for the ECR tool.

Continuing with the description of FIG. 1, plasma 22 is created in the processing chamber 16 by interaction of the transmitted microwave power with a magnetic field generated by electromagnetic coils 17. As is well known to those having skill in the art, the electromagnetic field is generated to create an electron cyclotron resonance region 23 in the plasma 22. For a typical microwave source having frequency of 2.45 GHz, the magnet 17 is regulated to generate a flux density of 875G at the electron cyclotron resonance 23 in the processing chamber 16. The plasma thus created operates to process a sample 20 held in place by a substrate holder 21 to provide etching, deposition or other operations according to techniques well known to those having skill in the art. The gas to supply plasma 22 is provided to the chamber 16 via inlet port 18 and exhausted via outlet port 19. The chamber may be divided into a source chamber 16B in which electron cyclotron resonance occurs, and a typically larger processing chamber 16A, in which the sample 20 is processed.

The design and operational details of ECR tool 10 are well known to those having skill in the art and will not be described further herein. However, it should be noted that in the ECR tool of FIG. 1, a high circulating power typically exists between the plasma 22 and the tuner 13. In other words, a large portion of the microwave source power $P_S$ is reflected back towards tuner 13 shown as a reflected wave $P_R$) with only a portion of the power $P_F$ emerging through plasma coupler being coupled to the plasma to create microwave power $P_P$ in the plasma.

Typically, tuner 13 must be manually tuned to maximize the power transmitted to the plasma. This tuning typically changes when any plasma parameter such as plasma concentration or gas type is changed, and the tuning may also need to be changed for a particular substrate as etching or deposition takes place. Tuning typically changes in an unpredictable manner. Accordingly, the need for tuning adjustments presents a design limitation in conventional ECR systems. Tuning requirements make ECR tool operation and substrate process development less repeatable and may prevent the achievement of optimum plasma densities, which reduces the ultimate deposition or etch rate.

ECR System of the Present Invention

Figure 2:
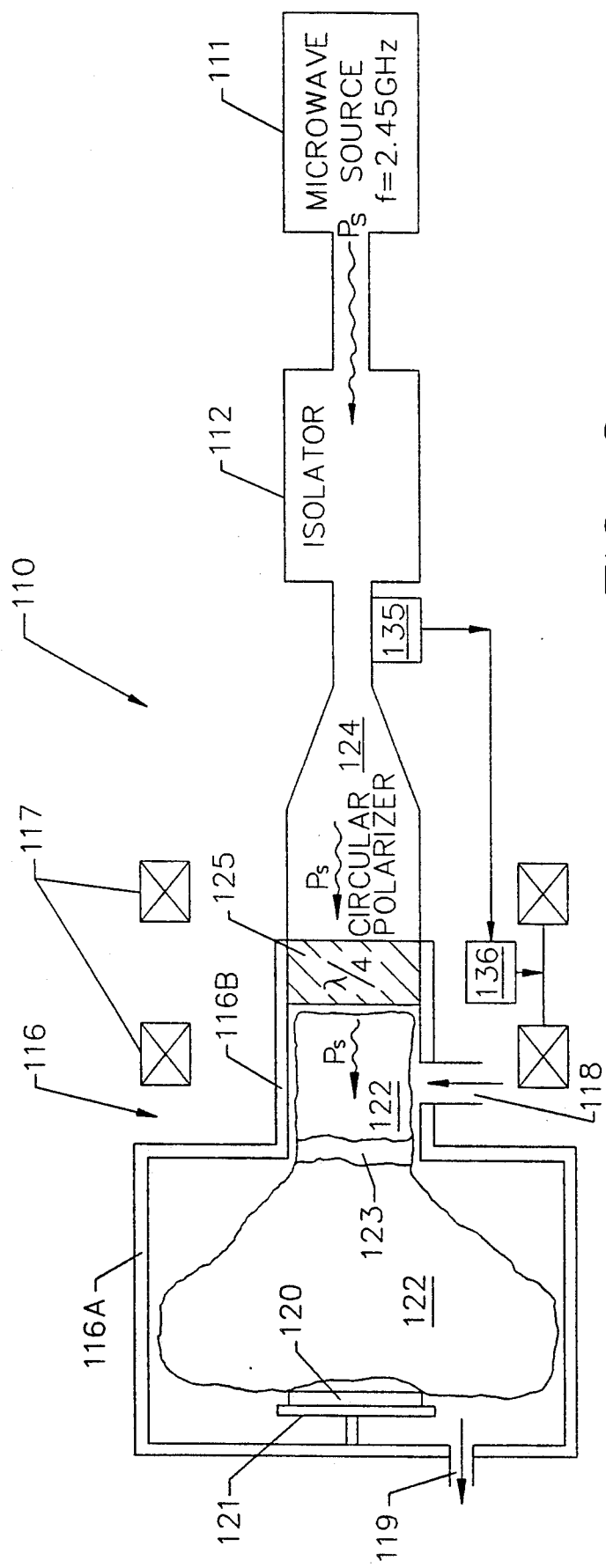
FIG. 2 is a simplified schematic diagram of an ECR tool according to the present invention.

Referring now to FIG. 2, an ECR system 110 according to the present invention will now be described. As already described, ECR system 110 may include a microwave source 111 and an isolator 112. However, in contrast with the system shown in FIG. 1, an external tuner 13 need not be used because adjustable tuning of the microwave system is not typically needed. According to the invention, impedance matching of the plasma wave to the plasma is accomplished by circularly polarizing the plasma wave using a circular polarizer 124, and matching the impedance of the circularly polarized plasma wave to the impedance of the plasma using an impedance transformer coupled between the circular polarizer and the plasma.

In particular, as shown in FIG. 2, the transformer preferably is in the form of a quarter wavelength vacuum window 125. As is well known to those having skill in the art, a quarter wavelength window has a thickness which is one quarter of the wavelength of the wave passing through the window, and substantially reduces or eliminates the energy reflecting back to the circular polarizer 124 if the characteristic impedance of the quarter wave window is correctly chosen. The window transforms the impedance of the wave to that of the plasma. Accordingly, substantially all of the source microwave power $P_S$ passes through the circular polarizer 124, is circularly polarized and passes through the plasma 122 to the ECR region 123. Enhanced plasma density without the need for adjustable tuning is thereby provided.

The general operation of the system of FIG. 2 will now be described. Typically the microwave source emits microwaves of frequency 2.45 GHz in a rectangular $TE_{10}$ mode. However, it will be understood by those having skill in the art that other modes may be used. According to the present invention, the microwave energy which contributes to electron cyclotron resonance is enhanced, and the microwave energy which does not contribute to electron cyclotron resonance is reduced, by circularly polarizing the incoming microwave in the direction in which the electrons rotate in the magnetic field provided by axial magnets 117.

Conventionally, magnets 117 produce a high field near the vacuum window 125 so that the electrons rotate in a clockwise circular direction in the chamber looking from the direction of the high magnetic field. Accordingly, the circular polarizing means 124 of the present invention preferably polarizes the incoming microwave energy in right hand circularly polarized (RHCP) cylindrical mode so that substantially all of the microwave energy transferred to the chamber 116 is polarized to reinforce the electron energy at the electron cyclotron resonance. In other words, the microwave energy is circularly polarized in the angular direction which reinforces the electron rotation caused by the magnetic field, to create electron cyclotron resonance. Preferably RHCP $TE_{11}$ mode energy is generated by the circular polarizer 124 although other circularly polarized modes may also be used. Extraneous modes, which do not contribute to electron cyclotron resonance are eliminated.

According to the invention, having eliminated the undesired modes of microwave transmission, the desired circularly polarized microwave is then coupled to the plasma to minimize reflection by providing a vacuum window 125 which also functions as an impedance matcher between the Circularly polarized wave and the plasma 122. Impedance matching is provided by the vacuum window 125 in two ways. First, the thickness of the vacuum window is made to be one quarter wavelength. Also, the dielectric constant of the window is chosen to provide an impedance match between the plasma and the circularly polarized microwave according to the following relationship:

$$Z_P \times Z_g = Z_W^2,$$

where $Z_P$ is the impedance of the plasma 122, $Z_g$ is the characteristic impedance of the circularly polarized microwave waveguide mode emerging from circular polarizer 124, and $Z_W$ is the characteristic impedance of the window 125. The quarter wavelength window 125 can couple the circularly polarized wave to the plasma over a broad range of conditions for at least two reasons. First, the plasma impedance is known, and varies slowly with plasma conditions, so that a quarter wave transformer provides a relatively broadband impedance match to the known impedance. Moreover, since the window directly couples the circularly polarized wave to the plasma without the need to impedance match additional elements, the quarter wavelength window may be selected to match the circularly polarized wave to the plasma with a high degree of effectiveness.

The following table describes the parameters of the quarter wavelength window 125 which may be used for high and low density plasmas, with a 2.45 GHz source, a $TE_{11}$ mode in a waveguide of radius 6 cm, and a 950G field at the window (875G at the ECR resonance):

| PLASMA DENSITY | QUARTER WAVELENGTH WINDOW | |
|---|---|---|
| | MATERIAL | THICKNESS |
| LOW ($<3 \times 10^{11}/cm^3$) | Quartz ($SiO_2$) | 1.63 cm |
| HIGH ($>10^{12}/cm^3$) | Alumina ($Al_2O_3$) | 0.98 cm |

Figure 3A:
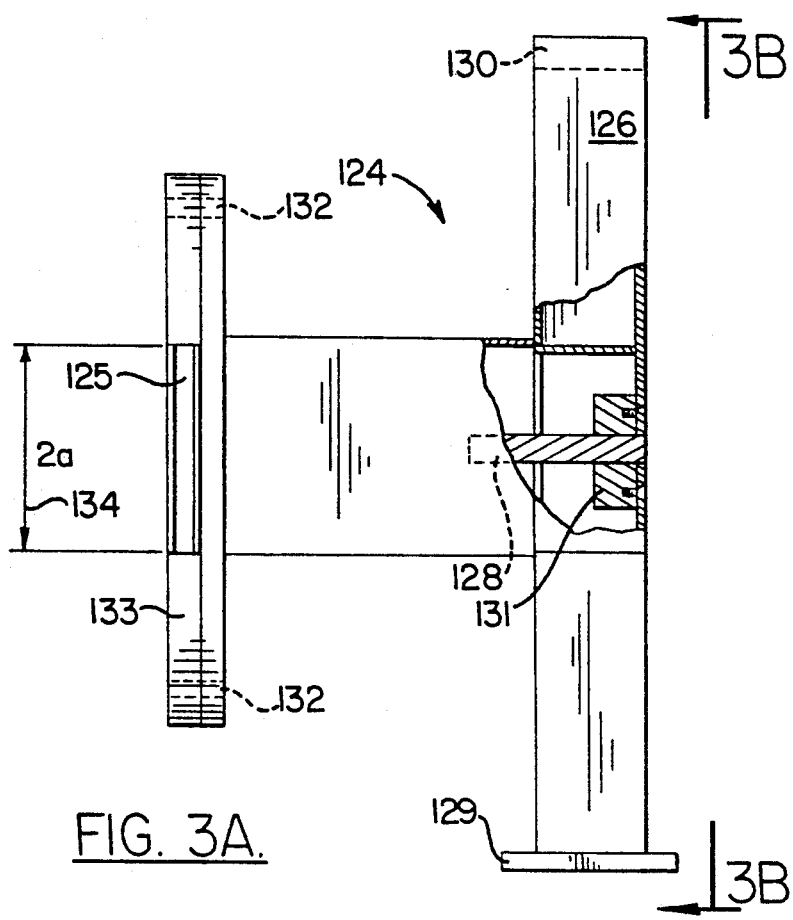
FIGS. 3A-3B illustrate a design for the circular polarizer of FIG. 2.
Figure 3B:
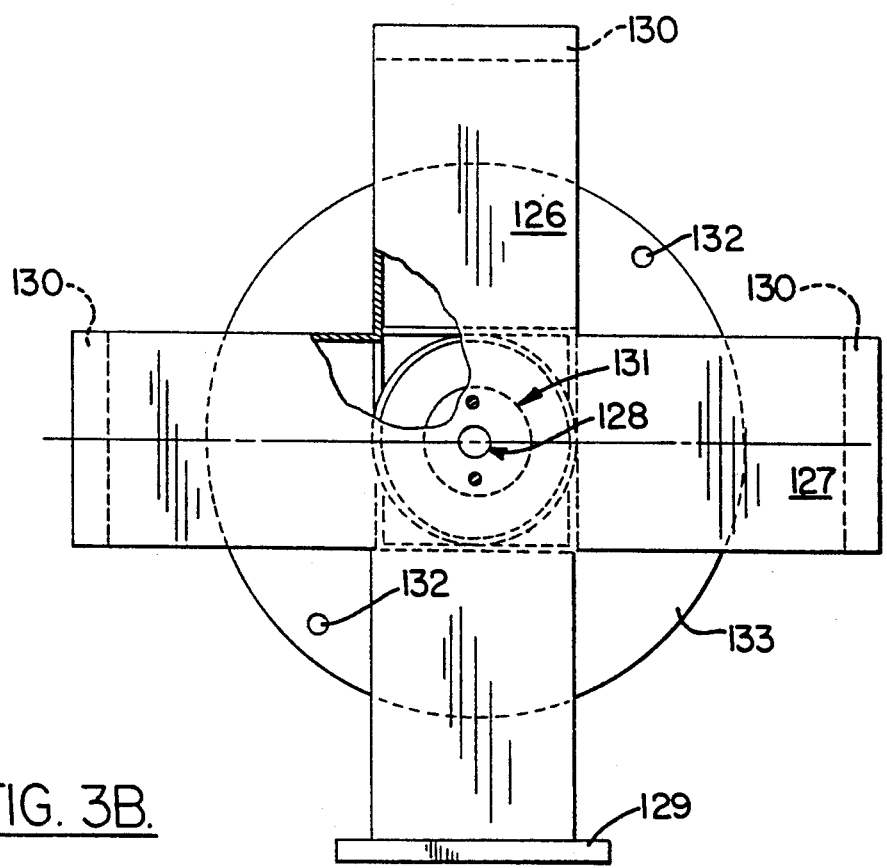

Referring now to FIGS. 3A and 3B, a detailed design of a circular polarizer 124 (FIG. 2) will now be described. As shown in FIG. 3, the right hand circular polarizer 124 for the incoming microwave may be implemented with a well known "turnstile branch circuit" which may be formed by crossing two 2WR284 rectangular waveguides disposed in communication with a hollow cylinder of radius "a" 134 at the intersection of the two waveguides. As also shown in FIG. 3, the two rectangular waveguides 126 and 127 may be provided with one or more fixed flanges 129, one or more adjustable sliding shorts 130 and one or more adjustable tuning stubs 128, 131, to allow for adjustment of the circular polarizer to minimize the amount of reflected energy. Bolt holes 132 may be provided on window flange 133 to bolt the quarter wave coupler 125 to the processing chamber 116.

The general operation of the invention will now be summarized. In general, matching of the microwave source 111 to the plasma ECR resonance 123 is accomplished in two ways. First, the right hand circularly polarized $TE_{11}$ cylindrical waveguide mode is used to produce only the plasma mode which is absorbed at the ECR resonance. In order to provide an ECR plasma source having plasma density greater than the critical density (i.e. an "overdense" ECR plasma source), the "whistler mode", which is a right hand circularly polarized mode, is preferably used. Since this wave is RHCP, matching to the whistler wave is most efficient if the coupler launches an RHCP wave itself.

Second, a quarter wave vacuum window is used to greatly reduce the reflected microwave power from the plasma surface by matching between the low plasma impedance and the relatively high waveguide impedance. Using these matching techniques the present invention reduces microwave losses so that more microwave power is available for plasma creation. The invention also eliminates the high electric fields due to large circulating power flows which may influence the plasma behavior in uncontrolled ways. The need for external tuners is reduced or eliminated. Reliability of plasma process development is thereby improved.

In some situations, it may be desirable to adjust the ECR system of FIG. 2 to more closely match the exact plasma density. This may be accomplished, according to the invention, by varying the power applied to magnets 117 by a small amount to minimize the reflected power, because the plasma impedance depends upon the magnetic field as well as density. For example, a directional coupler 135 coupled to a power meter or other known measuring means may be used to measure the reflected wave. The magnetic field generated by coils 117 may be manually adjusted to an automatic adjustment means, such as a controller 136 may be used in a well known feedback arrangement, to adjust the power into coils 117 to minimize the measured reflected wave. Exact coupling for varying plasma density may thereby be provided.

Quantitative Description

A mathematical description of the improved coupling of the present invention will now be provided. In general, improved coupling is provided according to the present invention by determining the impedance of the circularly polarized microwave energy and by determining the plasma surface impedance. The matching condition for a quarter wave transformer; i.e. $Z_P \times Z_W = Z_{window}^2$, where $Z_P$ is the plasma impedance, $Z_W$ is the circularly polarized (whistler) microwave and $Z_{window}$ is the impedance of the window; is then applied.

A model for the microwave coupling in an ECR etch tool can be derived from Maxwell's equations and the cold plasma dielectric tensor:

$$\nabla \times E = -\frac{\partial B}{\partial t} \quad (1)$$

$$\nabla \times B = c^{-2}\partial/\partial t(K \cdot E) \quad (2)$$

where $$K = \begin{vmatrix} \frac{(R+L)}{2} & \frac{-i(R+L)}{2} & 0 \\ \frac{i(R+L)}{2} & \frac{(R+L)}{2} & 0 \\ 0 & 0 & P \end{vmatrix} \quad (3)$$

$$R \approx 1 - \frac{\frac{\omega_{pe}^2}{\omega^2}}{\left(1 - \frac{\omega_{ce}}{\omega}\right)},$$

$$L \approx 1 - \frac{\frac{\omega_{pe}^2}{\omega^2}}{\left(1 + \frac{\omega_{ce}}{\omega}\right)},$$

$$P \approx 1 - \frac{\omega_{pe}^2}{\omega^2},$$

and $\omega$ is the microwave frequency, $\omega_{ce}$ and $\omega_{pe}$ are the electron cyclotron and electron plasma frequencies respectively. The frequency is assumed to be in the range $\omega < \sim \omega_{ce} < \sim \omega_{pe}$ and the field quantities have a exp(ikx-i$\omega$t) dependence. If the wave is RHCP and launched along the magnetic field $B_z$ with $k_i = 0$ then $E_x = iE_y$ and the wave equation is $$\frac{\partial^2 E_x}{\partial z^2} + Rk_0^2 E_x = 0, \quad (4)$$

where $k_0 = \omega/c$. The solution for plane wave propagation in the Z direction for a constant density is:

$$E_x = E_{x0}\exp(ik_0\sqrt{R}\, z) \quad (5)$$

and $$cB_y = \sqrt{R}\, E_x. \quad (6)$$

Figure 4:
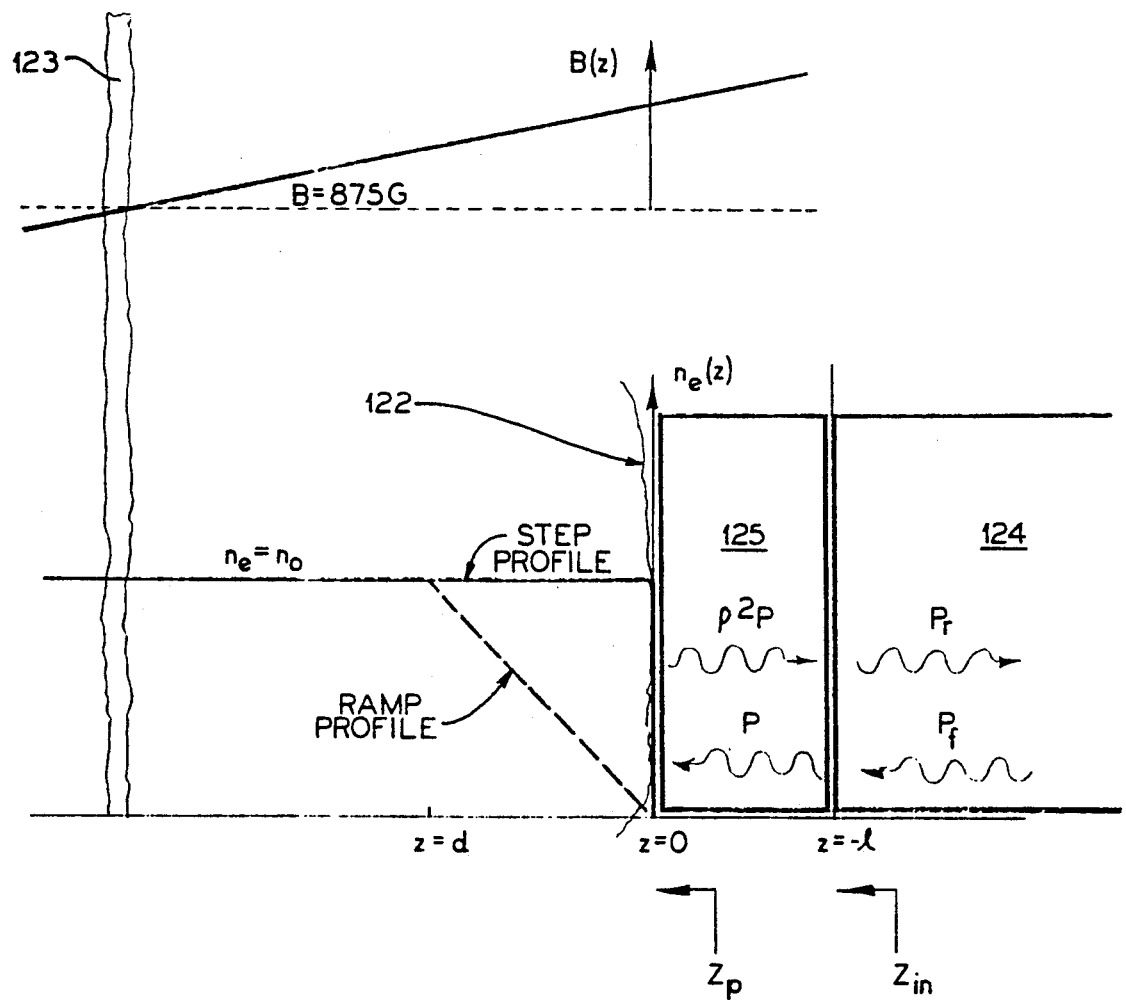
FIG. 4 is an illustration of microwave coupling by the quarter wavelength vacuum window of FIG. 2.

The plasma surface impedance may be calculated assuming a step function density profile at the plasma edge as shown by the solid line representing density in FIG. 4. The plasma surface impedance for the RHCP wave, normalized to free space, is $$\frac{Z_p}{Z_o} = \frac{E_x}{cB_y} \approx \frac{1}{\sqrt{R}} \quad (7)$$

where $Z_0 = 377\,\Omega$. Typically $Z_p/Z_O \approx 0.05$–$0.2$ for ECR parameters. The plasma surface impedance may be determined solely by the edge density and magnetic field and the calculation may assume that there is no reflection from points inside the plasma. This assumption is valid for the RHCP mode which is strongly absorbed at the ECR resonance, but it is a poor assumption for the LHCP mode which has no resonance but has a cutoff at $n_{e>} \sim 2n_c$. The impedance for the LHCP mode is similarly $Z_P/Z_O = 1/\sqrt{L}$ with this caveat. Note that the LHCP mode is not typically used with the present invention, and is included herein to illustrate the effectiveness of having the correct polarization. The details of the RHCP mode propagation and absorption do not affect the impedance calculation as long as the absorption is complete.

The externally incident microwave fields are necessarily confined in a waveguide 124 and these fields must be matched to the plasma wave fields at the boundary of plasma 122 adjacent window 125 in order to determine the reflection coefficient. However, the RHCP TE$_{11}$ mode in the dielectric window 125 is a good approximation to a plane wave incident on the plasma surface, so it is valid to simply match impedances at the plasma boundary. The reflection coefficient $\rho$ at the plasma surface is then related to $Z_P$ by the usual transmission line formula:

$$\frac{Z_p}{Z_w} = \frac{(1-\rho)}{(1+\rho)} \quad (8)$$

where $Z_W$ is the characteristic impedance of the dielectric window in contact with the plasma.

Figure 5:
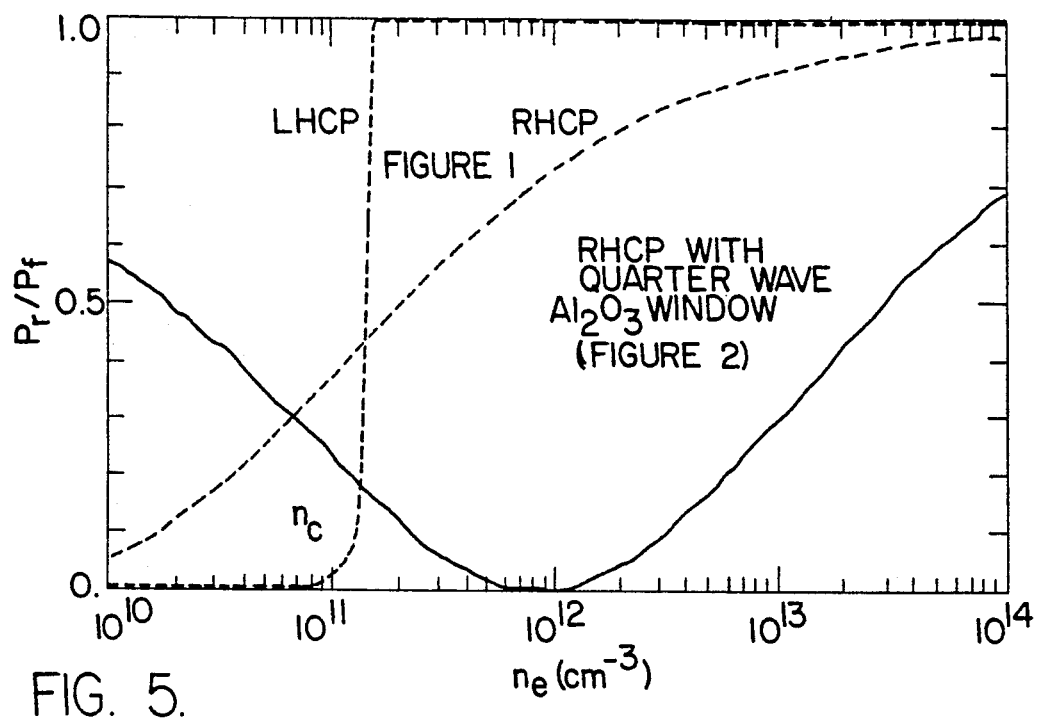
FIG. 5 is a graphical illustration of coupling efficiency in the tools of FIGS. 1 and 2.

Referring now to FIG. 5, a graph of the reflected power ratio versus edge density of the plasma is shown. The solid line represents an ECR system according to the present invention (FIG. 2) while the dashed lines represent reflection from the plasma if the effect of the window is ignored (FIG. 1). Reflected microwave power in conventional ECR systems would show behavior similar to the dashed lines, with their exact curves depending on the window thickness in those systems. According to the present invention, substantially no reflection takes place at plasma densities of $10^{12}$cm$^{-3}$ and only small reflection occurs for an order of magnitude above and below this value. Accordingly, the present invention provides optimum coupling over a wide range of plasma densities. The dashed lines in FIG. 5 show results of a calculation of reflected power ($\rho^2$) versus edge density for both TE$_{11}$ mode polarizations assuming a relative dielectric constant $\epsilon_r = 1$ for the window 15 and B=950G at the window. Note the large change in plasma load for the LHCP mode at $n_{e>} \sim 2n_c \approx 1.5 \times 10^{11}$ cm$^{-3}$ which must be compensated for by the external tuner 13. The experimental situation for the LHCP mode cannot be modeled reliably because of the possibility that some of the power is not absorbed. This unabsorbed power may eventually return as reflected power with an amplitude and phase depending on plasma conditions. Above about $1.5 \times 10^{11}$ cm$^3$, the LHCP mode is immediately cut off, and the phase of the reflected LHCP power at the turner location becomes fixed. Also note in FIG. 5 that the RHCP reflected power is large at the desired operating densities greater than about $10^{12}$cm$^{-3}$.

The final step in modeling the experimentally observed impedance, $Z_{in}$ is to include the effect of the vacuum window. This is calculated using the transmission line equation applied to $Z_p$ as indicated in FIG. 4:

$$Z_{in} = Z_w \frac{Z_p + Z_w\tanh(\beta l)}{Z_w + Z_p\tanh(\beta l)} \quad (9)$$

where $\beta l$ is the window thickness in wavelengths, tanh is the hyperbolic tangent, and $Z_W$ is the characteristic impedance of the dielectric window.

A refinement of the plasma density model can simulate the sheath at the plasma edge and gradients inside the plasma. Such a model is shown by the dashed line in FIG. 4 ("ramp profile") where the density starts from zero at the window 125 ($z=0$) and increases to a final value at some distance $z=d$ inside the plasma. The electric and magnetic field solutions in the density gradient region are given by Airy functions:

$$E_x = E_{xo} [a_1 Ai(w) + a_2 Bi(w)] \quad (10)$$

and $$cB_y = E_{xo}\left(\frac{-i}{\omega}\right)\left(\frac{dw}{dz}\right)[a_1 Ai'(w) + a_2 Bi'(w)] \quad (11)$$

where $w = -z[k_o^2 v n_e/n_c \omega_{pe}^2/\omega^2/(\omega_{ce}/\omega - 1)]^{\frac{1}{3}}$, and $a_1$ and $a_2$ are arbitrary constants. The Airy function solutions can be matched at $z=d$ to an outward going solution in the region $z>d$ and to forward and reflected waveguide fields at the plasma boundary ($z=0$), to determine the reflection coefficient p at the boundary. Numerical solutions of these equations show that the density gradient at the window introduces a small inductive component to the plasma impedance.

Normalized plasma impedances calculated from the step density model [Eq. (5)-(7)] and the density gradient model [Eq. (9)-(10)] are plotted as the lines $Z_p(d=0)$ and $Z_p(d=0.1$ cm), respectively, on a Smith chart in FIG. 6 for plasma densities ranging from $10^{11}$ to $10^{13}$ cm$^{-3}$, assuming a RHCP mode. Dashed lines labeled $d=o$ line are calculated from the step model and dashed lines labelled $d=0.1$ cm include the effect of a density ramp with $d=0.1$ cm. Experimental data for $Z_{in}$ (solid line) looking through the quarter wavelength alumina window lie near the center of the chart close to the $d=o$ line calculated from the model. The input impedance viewing the plasma through an approximately 0.14 wavelength quartz window is also shown. The density for the ramp model is taken as the plateau density ($n_e = n_o$ in FIG. 1) and $d=0.1$ cm is chosen as an upper bound for a density ramp at the vacuum window. The density ramp introduces a positive reactive part to $Z_p/Z_o$. Larger values for d in the ramp model will give larger reactive parts to $Z_p/Z_o$. However, one would not expect, nor have we observed, large scale density gradients along the magnetic field in the main body of the plasma. Thus, a simple density step at the window [Eqs. (5)-(7)] provides the best model for plasma impedance.

Finer details to the impedance model may include full two dimensional matching of the fields for the waveguide modes, which is needed to treat the $TM_{01}$ mode. Another improvement may include radially nonuniform plasma densities and magnetic fields at the window.

The plasma surface impedance for the absorbed RHCP mode is limited to a small range for a wide range of density ($Z_p/Z_o \approx 0.05-0.2$). According to the invention, it is possible to match the microwaves to the plasma with a fixed transforming element. The waveguide characteristic impedance for the RHCP $TE_{11}$ mode is slightly above that of free space: $Z_G/Z_o = 1/\sqrt{1-(f_c/f)^2} \approx 1.24$ for typical parameters, where $f_c = 0.293$ c/a is the cutoff frequency of the waveguide. The two real impedances, $Z_p$ and $Z_G$, are matched according to the invention using a quarter wave transformer with a characteristic impedance $\sqrt{Z_p \times Z_G} \sim 0.25-0.5$.

The vacuum window itself is ideally suited for use as the quarter wave transformer because it can have the correct characteristic impedance given by $Z_w/Z_o = 1/\epsilon_r - (f_c/f)^2$ the $TE_{11}$ mode, using materials such as alumina ($Z_w/Z_o \approx 0.3$) or quartz ($Z_w/Z_o \approx 0.55$), where $Z_w$ is the window impedance, $Z_o$ is the impedance of free space, $\epsilon_r$ is the window's dielectric constant, and $f_c/f$ is the cutoff frequency of the waveguide. Also, the vacuum window is already in the circuit, and it does not affect the mode polarization. Thus, according to the invention, a quarter wave vacuum window with a RHCP $TE_{11}$ mode polarizer provides good coupling in an ECR etch tool without external tuning.

Figure 6:
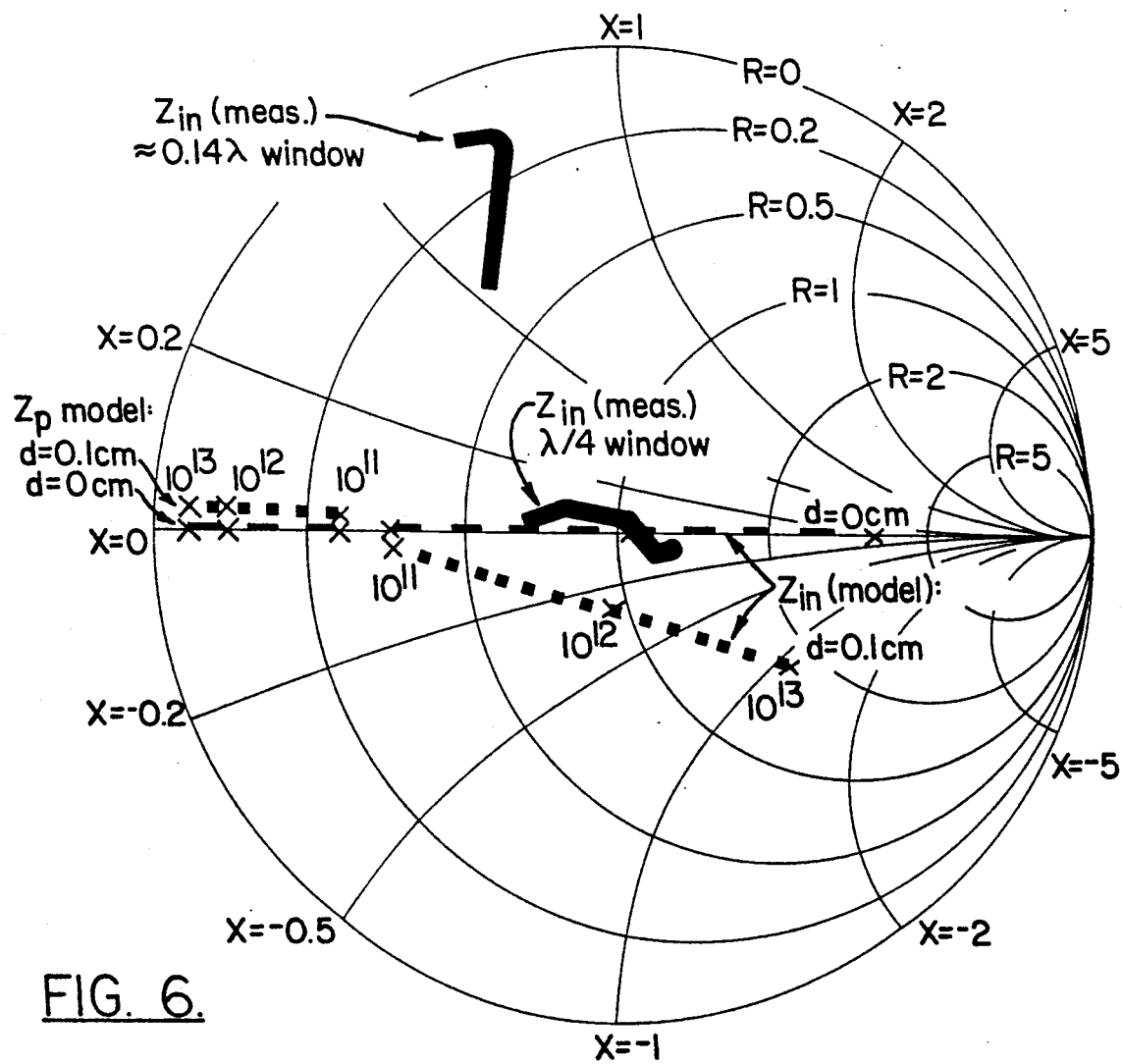
FIG. 6 is an impedance diagram for the tools of FIGS. 1 and 2.

The solid line in FIG. 5 shows the predicted reflection coefficient for the $TE_{11}$ RHCP mode with an alumina (real part of dielectric constant $\epsilon_r = 9.8$) quarter wavelength matching section. The model predicts good matching near the reflection minimum for an order of magnitude variation in edge density without further tuning. The density of minimum reflection can be adjusted with magnetic field or window material according to $$\frac{n_e (min)}{n_c} \approx \epsilon_r^2 \left(\frac{B}{B_o} - 1\right). \quad (12)$$

where $B_o = 875G$ for a microwave frequency of 2.45 GHz for the RHCP-$\lambda/4$ window coupler design. The dashed lines, labelled $Z_{in}$(model) in FIG. 6, show the location of the input impedances resulting from the quarter wave matching design applied to $Z_p$. Note that $Z_{in}$(model) is near the center of the Smith chart when the plasma has no reactive component, indicating a good match.

It should also be noted that the $TE_{11}$ mode-quarter wave matched coupler design is circularly symmetric due to the rotation of the wave, and that it can be scaled to any radius 134 ($a > 0.293c/f$) source chamber by simply tapering the circular waveguide radius to the desired size.

Experimental Data

The following experiments were conducted to confirm the improved plasma coupling according to the invention, using a system as illustrated in FIG. 2, compared to a conventional ECR tool as illustrated in FIG. 1. The ECR chamber 16, 6 consists of a 15 cm diameter stainless steel source chamber 16B, 116B, connected to a 60 cm diameter process chamber 16A, 116A. The source is surrounded by a pair of magnet coils 17, 117 and the field lines flair out into the process chamber where the wafer holder 21, 121 is located. A third coil can be used to control the magnetic field in the process chamber but was not used for the data presented herein.

Microwave power in the range of 300-1500W was applied through a ceramic window on one end of the source 11, 111 using couplers which convert the power into a circular waveguide mode. In the conventional tool (FIG. 1) a coupler 14 which produces a $TM_{01}$ mode was used. According to the invention, a circular polarizer 124 which produces a $TE_{11}$ mode with either RHCP or LHCP polarization was used. The $TM_{01}$ coupler 14 launches 50% of the power in each of the RHCP and LHCP polarizations. The $TE_{11}$ circular polarizer 124 is of the turnstile type where power into one rectangular port produces a wave of arbitrary polarization in the circular guide, and reflected power exits through a second rectangular port. Bench testing showed that it produced RHCP and LHCP modes with more than 98% polarization. The plasma impedance was determined from the relative phase and amplitude of the reflected and forward powers. The phase zero at the window position was determined by measuring the phase with a short at the window.

Two vacuum windows were used. In the conventional system of FIG. 1, a commercial quartz window 15, about 0.9 cm thick was used which implies an approximate electrical length of about 0.14 wavelength assuming a dielectric constant of 4. In the system of the present invention (FIG. 2), a window 125 was custom made to be a quarter wavelength ($\approx 0.98$ cm) thick in alumina ($Al_2O_3$).

Figure 7A:
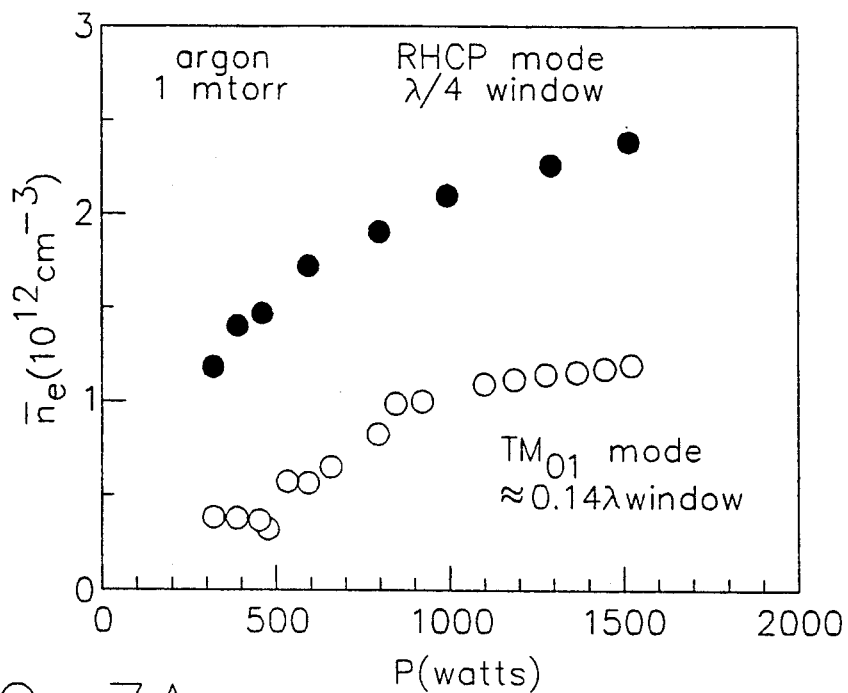
FIGS. 7A-7B are a graphical representation of average plasma density versus power systems of FIGS. 1 and 2.
Figure 7B:
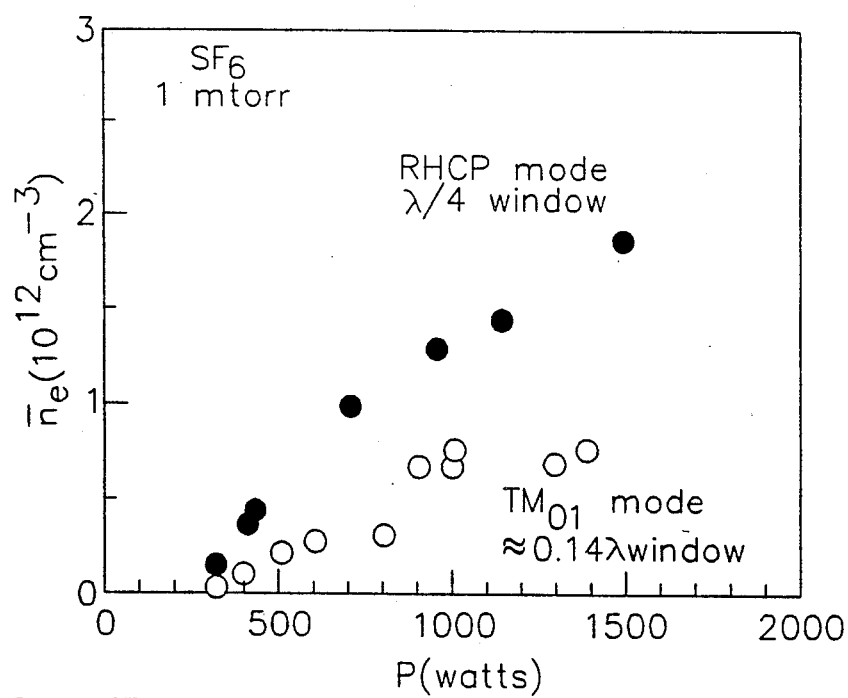

Experimental measurements of line average electron density vs. power in the source region of the ECR tools is shown in FIGS. 7A and 7B for argon and $SF_6$ working gases at 1 millitorr pressure with a flow rate of about 20 sccm. Data for the conventional $TM_{01}$ mode was taken with the 0.14λ quartz window, and a three stub tuner 13 was used to adjust the match for each data point.

The RHCP coupler and quarter wavelength window design of the present invention produces a smoothly increasing plasma density versus power curve, and maximum average densities of $2.3 \times 10^{12} cm^{-3}$ were achieved in argon at microwave power of 1500W and magnetic field strength of 950G at the window without external tuning (FIG. 7A). Line-average densities rising linearly to almost $2 \times 10^{12} cm^{-3}$ were achieved in $SF_6$ (FIG. 7B) at 1500W, again without active external tuning. The impedance derived from the measured reflected power and phase is plotted as a line labeled $Z_{in}$(meas.) on the Smith chart of FIG. 6 and agrees well with the model predictions assuming a narrow sheath region (d much less than 0.1 cm). Longer gradient lengths would produce data with a much larger reactive part. Thus, the simple step model for the plasma density is sufficient to describe the actual experimental data. Plasma densities in the process chamber are about an order of magnitude less than in the source. At low pressures ($\leq 1$ mTorr) the process chamber density is related to the source density by approximately the ratio of the magnetic field strengths of the two regions. As clearly seen in FIGS. 7A and 7B, at least twice the average plasma density is obtained for a given input power, compared to the conventional design.

The nonlinear density versus power behavior of the $TM_{01}$ mode below about 500 watts in FIG. 7A is likely due to the fact that the density is sufficiently low that the LHCP mode can propagate in the plasma. Since the LHCP mode has no resonance for absorption, some of that power is reflected back to the tuner with a phase and amplitude depending highly on the plasma parameters. Tuning difficulties, such as hysteresis, were observed for powers less than 500 watts. Powers greater than 500 watts were sufficient to raise the plasma edge density well above $2n_c \approx 1.5 \times 10^{11} cm^{-3}$, which caused the LHCP polarization to be reflected immediately at the plasma-window interface and allowed it to be converted in a stable way to the RHCP mode by the tuner. An increasing density versus power was then achieved and tuning became easier. Data for both argon (FIG. 7A) and $SF_6$ (FIG. 7B) showed this nonlinear behavior. The breakpoints of about 500W for argon and about 800W for $SF_6$ are probably dependent on the specific size of the system.

Figure 8A:
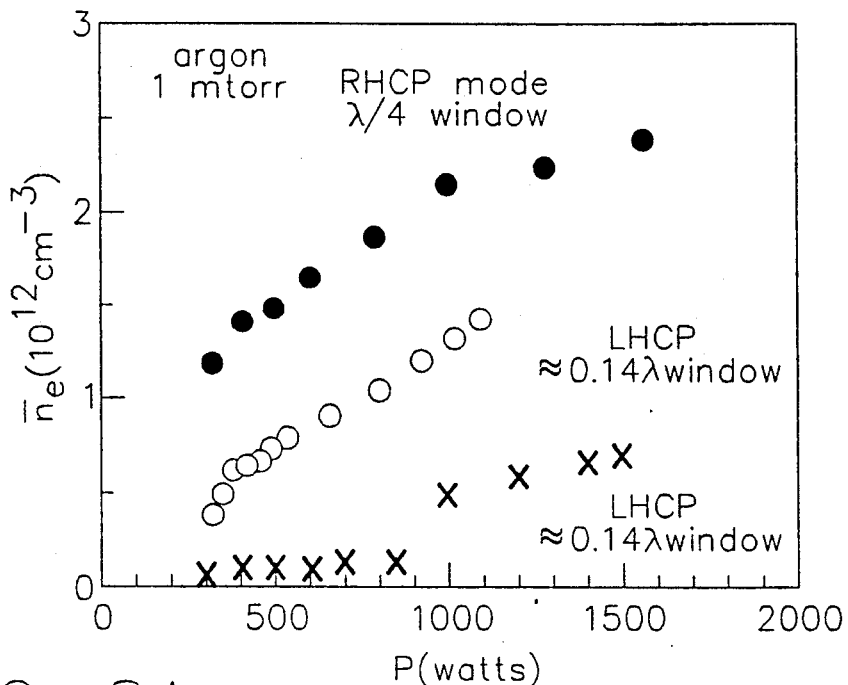
FIGS. 8A-8B are another graphical description of average plasma density versus power for the systems of FIGS. 1 and 2.

FIG. 8A also shows the effect of the mode polarization and window thickness on the operation of the ECR source. Data was taken in argon using no external tuning. The density versus power curve for the conventional RHCP mode-0.14 wavelength window configuration shows a smoothly increasing behavior. The anomalous behavior below 500 W seen with the $TM_{01}$ mode is not present, which is consistent with the fact that the LHCP mode is no longer present to complicate the tuning. However, a poor match was obtained without external tuning. This same data for the RHCP-0.14 wavelength quartz window is also plotted as the line labeled $Z_{in}(0.14\lambda)$ in FIG. 6. The LHCP-$TE_{11}$ mode with the 0.14λ quartz window produces a very low density until the power exceeds about 1000 W. The low source density, $\bar{n}_{e<} \sim 1.2 \times 10^{11} cm^{-3}$, is not unexpected because the LHCP mode is cut off for densities above about $1.5 \times 10^{11} cm^{-3}$. The line average density in the source region jumps to about $6 \times 10^{11} cm^{-3}$ for power greater than 1000W and is correlated with the observation of nonlinear behavior in the frequency spectrum from a probe in the source region. This nonlinear mechanism for plasma creation with the LHCP mode is not very efficient or controllable compared to using the RHCP mode. Results for the RHCP-quarter wavelength window configuration of the present invention from FIG. 7A are replotted in FIG. 8A for comparison.

Figure 8B:
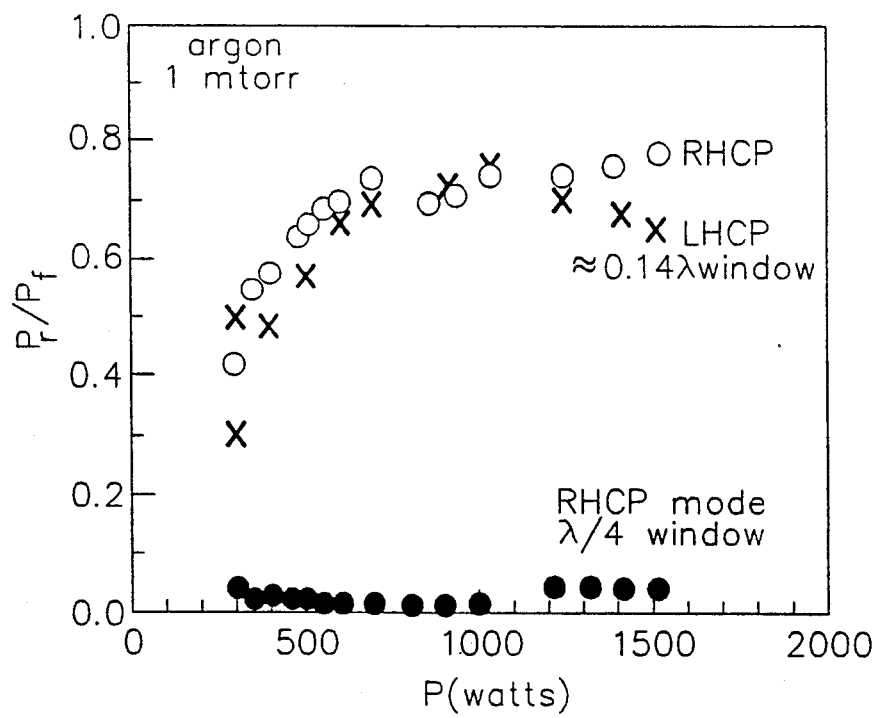

FIG. 8B shows the effect of wave polarization and window thickness on the fraction of the reflected power for the three coupler configurations discussed in FIG. 8A. As predicated from the model, the RHCP-quarter wavelength window design of the present invention has low reflection without tuning, and it passes through a minimum reflection as a function of power and density (FIG. 5). High reflected powers (40-80%) occur for the RHCP-0.14 wavelength quartz window configuration because of the impedance mismatch from the plasma and window. The reflection for the LHCP-0.14 wavelength window is also high (30-70%).

In an ECR tool, the microwave power sustains the plasma through which the waves propagate. One consequence of this nonlinearity is that the microwave source operated less well on the low density side of the $P_r/P_f$ versus density curve (FIG. 5). Small density changes will tend to be damped out on the high density side of the curve because an increasing density will decrease the net input power [$\alpha 1 - \rho^2$] and thus tend to force the density lower. On the other hand, a decreasing density will increase the net input power, thus tending to force the density higher. In contrast operation on the low density side of the curve is unstable to density fluctuations. It should be noted that this instability may occur in all end launched ECR sources and is not a result of the present invention.

This instability is not a serious limitation for the present invention because the operating point on the $P_r/P_f$ versus density curve is controllable by the magnetic field at the window as well as by the density. A proper choice of the magnetic field at the window will place the ECR source in the stable operating range without the need for further fine adjustment with external tuners.

Equation (12) demonstrates that magnetic field strength is the only impedance control parameter for the RHCP quarter window coupler design, and it may be adjusted according to the window material and the typical achievable plasma density. In fact, the reflected microwave power can be fine tuned to nearly zero by making small (e.g. less than 2%) changes in the magnetic field at the window. As already described, this adjustment is easily incorporated into a feedback scheme to minimize the already small reflected power.

Finally, the system of the present invention does not depend on having a turnstile or other 3-port type polarizer. Two port polarizers are simpler to construct and may be used as long as the small reflected power returning in the wrong (LHCP) mode can be tolerated. For example, the circular polarizer of FIG. 3 was operated as a 2-port device by shorting the load port, in which case the small amount of reflected power (less than about 5%) is returned to the plasma as a LHCP mode. For $n_e \geq 2n_c$, this power is again reflected from the plasma and is absorbed in the circulator load. The construction of simpler two port polarizers are well known to those having skill in the art.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electron cyclotron resonance apparatus comprising:
    a processing chamber;
    gas supplying means for supplying gas to said processing chamber;
    microwave generating means for generating microwave energy;
    circular polarizing means coupled to said microwave generating means, for circularly polarizing the microwave energy in a first angular direction and for suppressing circularly polarized microwave energy in a second angular direction opposite the first angular direction;
    magnetic field generating means for generating a magnetic field in said processing chamber, the magnetic field causing electrons in said processing chamber to rotate in the first angular direction in electron cyclotron resonance to thereby generate a plasma of the gas in the processing chamber;
    transforming means coupled between said circular polarizing means and said processing chamber, for matching the impedance of said circularly polarized microwave energy in the first angular direction, to the impedance of said plasma, to thereby couple the circularly polarized microwave energy in the first angular direction to the plasma; and
    means for adjusting said magnetic field generating means to minimize remnants of microwave energy which are reflected from the plasma;
    wherein said adjusting means comprises:
    means, coupled to said processing chamber, for measuring said remnants of reflected microwave energy in said chamber; and
    an electronic controller, responsive to said measuring means and operatively connected to said magnetic field generating means, for adjusting said magnetic field generating means to minimize the measured remnants of reflected microwave energy.

2. The electron cyclotron resonance apparatus of claim 1 wherein said transforming means comprises a window coupled between said circular polarizing means and the processing chamber, at least one of the composition and the thickness of said window being selected to match the impedance of said circularly polarized microwave energy to the impedance of said plasma in the chamber.

3. The electron cyclotron resonance apparatus of claim 2 wherein said microwave generating means generates microwave energy of a predetermined frequency and wherein the thickness of said window is one quarter wavelength of the predetermined frequency.

4. The electron cyclotron resonance apparatus of claim 2 wherein the composition of said window is selected to produce an impedance equal to the square root of the impedance of the plasma times the impedance of the circularly polarized microwave energy.

5. The electron cyclotron resonance apparatus of claim 2 wherein said window comprises a vacuum window for sealing said chamber.

6. The electron cyclotron resonance apparatus of claim 1 wherein said circular polarizing means polarizes the microwave energy in right hand circular polarization.

7. The electron cyclotron resonance apparatus of claim 1, wherein said circular polarizing means polarizes the microwave energy in right hand circularly polarized $TE_{11}$ mode.

8. The electron cyclotron resonance apparatus of claim 1 wherein said transforming means comprises a fixed transforming which is free of adjustment means.

9. The electron cyclotron resonance apparatus of claim 2 wherein said microwave generating means generates microwave energy at 2.45 gigahertz; wherein said magnetic field generating means generates a magnetic field at electron cyclotron resonance of 875 Gauss strength; wherein said plasma in said chamber has a density greater than about $10^{12}$ per cubic centimeter; wherein said circular polarizing means polarizes the microwave energy in right hand circularly polarized $TE_{11}$ mode with a radius of 6 cm; wherein the composition of said window comprises alumina; and wherein the thickness of said window is 0.98 centimeters.

10. The electron cyclotron resonance apparatus of claim 2 wherein said microwave generating means generates microwave energy at 2.45 gigahertz; wherein said magnetic field generating means generates a magnetic field at electron cyclotron resonance of 875 Gauss strength; wherein said plasma in said chamber has a density less than about $3 \times 10^{11}$ per cubic centimeter; wherein said circular polarizing means polarizes the microwave energy in right hand circularly polarized $TE_{11}$ mode with a radius of 6 cm; wherein the composition of said window comprises quartz having dielectric constant of 3.85; and wherein the thickness of said window is 1.63 centimeter.

11. The method for coupling a microwave source in an electron cyclotron resonance system, the electron cyclotron resonance system including a processing chamber, means for supplying gas to the processing chamber, and means for generating a magnetic field in the processing chamber, the magnetic field causing electrons in the processing chamber to rotate in a first angular direction in electron cyclotron resonance to thereby generate a plasma of the gas in the processing chamber, said method comprising the steps of:
    circularly polarizing the microwave energy from the microwave source in the first angular direction and suppressing circularly polarized microwave energy in a second angular direction opposite the first angular direction;
    matching the impedance of the circularly polarized microwave energy in the first angular direction to the impedance of the plasma; and adjusting the magnetic field generating means to minimize remnants of microwave energy which are reflected from the plasma;

wherein said adjustment step comprises the steps of:
measuring the remnants of microwave energy which are reflected from the plasma; and
adjusting the magnetic field generating means to minimize the remnants of the measured reflected microwave energy.

12. The method of claim 11 wherein said impedance matching step comprises the step of directly coupling the circularly polarized microwave energy to the plasma with a quarter wavelength transformer.

13. The method of claim 12 wherein said impedance matching step further comprises the step of directly coupling the circularly polarized microwave energy to the plasma with a quarter wavelength transformer having an impedance equal to the square root of the impedance of the plasma times the impedance of the circularly polarized microwave energy.

14. The method of claim 11 wherein said circularly polarizing step comprises the step of right hand circular polarizing the microwave energy.

15. The method of claim 14 wherein said right hand circular polarizing step comprises the step of right hand circular polarizing the energy from the microwave source into right hand circularly polarized $TE_{11}$ mode.

* * * * *

UNITED STATES PATENT AND TRADEMARK OFFICE
CERTIFICATE OF CORRECTION

PATENT NO. : 5,111,111
DATED : May 5, 1992
INVENTOR(S) : Stevens et al.

It is certified that error appears in the above-identified patent and that said Letters Patent is hereby corrected as shown below:

Column 4, line 22, after "provides" please insert --optimum--.

Column 4, line 36, after "be" please insert --obtained--.

Column 4, line 66, delete "embodiment" and substitute "embodied" therefor.

Column 4, line 67, after "different" please insert --forms--.

Column 4, line 68, please delete "e" and substitute --embodiment-- therefor.

Column 4, line 68, after "this embodiment" please insert --provided--.

Column 5, line 1, please delete "a co" and substitute --and complete-- therefor.

Column 9:

Please delete:

$$\nabla x E = -\frac{\partial B}{\partial t}$$

and substitute therefor:

$$\nabla x \overline{E} = -\frac{\partial \overline{B}}{\partial t}$$

UNITED STATES PATENT AND TRADEMARK OFFICE
CERTIFICATE OF CORRECTION

PATENT NO.   : 5,111,111
DATED        : May 5, 1992
INVENTOR(S)  : Stevens et al.

It is certified that error appears in the above-identified patent and that said Letters Patent is hereby corrected as shown below:

Please delete:

$$\nabla x B = c^{-2} \partial/\partial t (K \cdot E)$$

and substitute therefor:

$$\nabla x \overline{B} = c^{-2} \partial/\partial t (\overline{\overline{K}} \cdot E)$$

Please delete:

$$K = \begin{vmatrix} \frac{(R+L)}{2} & \frac{-i(R+L)}{2} & 0 \\ \frac{i(R+L)}{2} & \frac{(R+L)}{2} & 0 \\ 0 & 0 & P \end{vmatrix}.$$

and substitute therefor:

$$\overline{\overline{K}} = \begin{vmatrix} \frac{(R+L)}{2} & \frac{-i(R-L)}{2} & 0 \\ \frac{i(R-L)}{2} & \frac{(R+L)}{2} & 0 \\ 0 & 0 & P \end{vmatrix},$$

UNITED STATES PATENT AND TRADEMARK OFFICE
CERTIFICATE OF CORRECTION

PATENT NO. : 5,111,111
DATED : May 5, 1992
INVENTOR(S) : Stevens et al.

It is certified that error appears in the above-identified patent and that said Letters Patent is hereby corrected as shown below:

Column 12, lines 1-2, please delete "$(Z_w/Z_o \approx 200.55)$," and substitute --$(Z_w/Z_o \approx 0.55)$,-- therefor.

Column 12:

Please delete:

$$\frac{n_e(\min)}{n_c} = \varepsilon_r^2 \left(\frac{B}{B_o} - 1\right) .$$

and substitute therefor:

$$\frac{n_e(\min)}{n_c} = \varepsilon_r^2 \left(\frac{B}{B_o} - 1\right) ,$$

Column 12, line 46, please delete "16, 6" and substitute --16, 116-- therefor.

Column 16, line 37, please delete "centimeters" and substitute --centimeter-- therefor.

Signed and Sealed this

Twenty-fourth Day of August, 1993

Attest:

BRUCE LEHMAN

Attesting Officer — Commissioner of Patents and Trademarks